United States Patent
Maehashi et al.

(10) Patent No.: US 8,711,259 B2
(45) Date of Patent: Apr. 29, 2014

(54) SOLID-STATE IMAGING APPARATUS

(75) Inventors: Yu Maehashi, Kawasaki (JP); Hiroki Hiyama, Sagamihara (JP); Tetsuya Itano, Sagamihara (JP); Kazuhiro Saito, Tokyo (JP); Kohichi Nakamura, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 19 days.

(21) Appl. No.: 13/614,121

(22) Filed: Sep. 13, 2012

(65) Prior Publication Data

US 2013/0088292 A1 Apr. 11, 2013

(30) Foreign Application Priority Data

Oct. 7, 2011 (JP) ................. 2011-223309

(51) Int. Cl.
*H04N 9/083* (2006.01)
*H04N 3/14* (2006.01)
*H03K 5/153* (2006.01)

(52) U.S. Cl.
USPC .............................. 348/294; 348/300; 327/77

(58) Field of Classification Search
USPC ..................... 348/294, 300; 327/77
See application file for complete search history.

(56) References Cited

U.S. PATENT DOCUMENTS

| | | | |
|---|---|---|---|
| 5,936,434 A * | 8/1999 | Kumamoto et al. | 327/77 |
| 6,188,094 B1 | 2/2001 | Kochi et al. | 257/232 |
| 6,670,990 B1 | 12/2003 | Kochi et al. | 348/310 |
| 6,960,751 B2 | 11/2005 | Hiyama et al. | 250/208.1 |
| 7,110,030 B1 | 9/2006 | Kochi et al. | 348/308 |
| 7,126,102 B2 | 10/2006 | Inoue et al. | 250/214 R |
| 7,187,052 B2 | 3/2007 | Okita et al. | 257/444 |
| 7,283,305 B2 | 10/2007 | Okita et al. | 359/619 |
| 7,321,110 B2 | 1/2008 | Okita et al. | 250/208.1 |
| 7,408,210 B2 | 8/2008 | Ogura et al. | 257/233 |
| 7,429,764 B2 | 9/2008 | Koizumi et al. | 257/292 |
| 7,460,162 B2 | 12/2008 | Koizumi et al. | 348/294 |
| 7,462,810 B2 | 12/2008 | Kobayashi et al. | 250/208.1 |
| 7,528,878 B2 | 5/2009 | Sato et al. | 348/317 |
| 7,538,804 B2 | 5/2009 | Okita et al. | 348/241 |
| 7,550,793 B2 | 6/2009 | Itano et al. | 257/239 |
| 7,557,847 B2 | 7/2009 | Okita et al. | 348/308 |
| 7,592,579 B2 | 9/2009 | Tamura et al. | 250/208.1 |
| 7,638,826 B2 | 12/2009 | Hiyama et al. | 257/291 |
| 7,719,587 B2 | 5/2010 | Ogura et al. | 348/302 |
| 7,741,593 B2 | 6/2010 | Iwata et al. | 250/214 R |
| 7,755,688 B2 | 7/2010 | Hatano et al. | 348/300 |
| 7,812,873 B2 | 10/2010 | Hiyama et al. | 348/294 |
| 7,812,876 B2 | 10/2010 | Hiyama et al. | 348/300 |

(Continued)

FOREIGN PATENT DOCUMENTS

| | | |
|---|---|---|
| JP | 10-256884 A | 9/1998 |
| JP | 2002-232291 A | 8/2002 |
| JP | 2008-187420 A | 8/2008 |

*Primary Examiner* — Joel Fosselman
(74) *Attorney, Agent, or Firm* — Fitzpatrick, Cella, Harper & Scinto

(57) ABSTRACT

A solid-state imaging apparatus includes: an amplifier circuit configured to amplify a signal from pixel; and a reference signal generating circuit configured to generate a ramp signal, wherein feedback capacitor elements having the same structure are electrically connected to a capacitive feedback type amplifier of the amplifier circuit and to a capacitive feedback type amplifier of the reference signal generating circuit respectively, and a connecting configuration between an amplifier of the amplifier circuit and the feedback capacitor element and a connecting configuration between an amplifier of the reference signal generating circuit and the feedback capacitor element are the same.

6 Claims, 3 Drawing Sheets

(56) References Cited

U.S. PATENT DOCUMENTS

| | | | |
|---|---|---|---|
| 7,825,974 B2 | 11/2010 | Itano et al. | 348/308 |
| 7,920,192 B2 | 4/2011 | Watanabe et al. | 348/308 |
| 7,982,789 B2 | 7/2011 | Watanabe et al. | 348/308 |
| 8,023,025 B2 | 9/2011 | Itano et al. | 348/308 |
| 8,045,034 B2 | 10/2011 | Shibata et al. | 348/308 |
| 8,081,245 B2 | 12/2011 | Itano et al. | 348/301 |
| 8,085,319 B2 | 12/2011 | Ono et al. | 348/241 |
| 8,106,955 B2 | 1/2012 | Okita et al. | 348/220.1 |
| 8,120,686 B2 | 2/2012 | Hatano et al. | 348/308 |
| 8,159,577 B2 | 4/2012 | Iwata et al. | 348/296 |
| 8,208,055 B2 | 6/2012 | Hiyama | 348/300 |
| 8,218,050 B2 | 7/2012 | Ogura et al. | 348/308 |
| 8,289,431 B2 | 10/2012 | Itano | 348/308 |
| 8,325,260 B2 | 12/2012 | Yamazaki et al. | 348/308 |
| 8,363,137 B2 | 1/2013 | Sonoda et al. | 348/302 |
| 2009/0021411 A1 | 1/2009 | Maruyama | 341/155 |
| 2009/0322922 A1 | 12/2009 | Saito et al. | 348/308 |
| 2010/0060762 A1 | 3/2010 | Takada et al. | 348/300 |
| 2010/0295978 A1 | 11/2010 | Nakamura et al. | 348/273 |
| 2011/0169996 A1 | 7/2011 | Takada et al. | 348/340 |
| 2012/0026371 A1 | 2/2012 | Itano et al. | 348/301 |
| 2013/0026343 A1 | 1/2013 | Saito et al. | 250/208.1 |
| 2013/0057742 A1 | 3/2013 | Nakamura et al. | 348/302 |
| 2013/0062503 A1 | 3/2013 | Saito et al. | 250/208.1 |
| 2013/0068930 A1 | 3/2013 | Nakamura et al. | 250/208.1 |
| 2013/0088625 A1 | 4/2013 | Iwata et al. | 348/300 |
| 2013/0089320 A1 | 4/2013 | Hiyama et al. | 398/9 |

\* cited by examiner

SOLID-STATE IMAGING APPARATUS

BACKGROUND OF THE INVENTION

1. Field of the Invention

One disclosed aspect of the embodiments relates to a solid-state imaging apparatus having an analog-to-digital conversion circuit (A/D conversion circuit).

2. Description of the Related Art

A solid-state imaging apparatus such as a CMOS image sensor, which has an A/D conversion circuit built-in, is used in an image-inputting equipment such as a digital camera. The A/D conversion circuit which is built in the solid-state imaging apparatus obtains digital data by subjecting a pixel signal in each column and a ramp signal (reference signal) which is common in each column, to comparison processing. Japanese Patent Application Laid-Open No. 2008-187420 discloses a structure of obtaining the ramp signal by charging and discharging an electric current to/from a capacitive feedback type amplifier, for a ramp signal generating circuit for generating a ramp signal.

SUMMARY OF THE INVENTION

However, when the capacitive feedback type amplifier is used in the ramp signal generating circuit, there has been a problem that because the capacitance of the capacitor element has voltage dependency, the linearity in the A/D conversion results in being aggravated.

An object of the embodiments is to provide a solid-state imaging apparatus which can perform A/D conversion with adequate A/D conversion accuracy, even when the capacitive feedback type amplifier is used for the generation of the ramp signal. According to one aspect of the embodiments, the solid-state imaging apparatus includes: a plurality of pixels arranged two dimensionally, each pixel including a photoelectric conversion element; amplifier circuits, each arranged correspondingly to each of the columns of the pixels, configured to amplify a signal from the pixel; a reference signal generating circuit configured to generate a reference signal that changes monotonously with time; and an A/D conversion circuit configured to perform an analog-to-digital conversion of the signal from the pixel, based on a signal outputted from the amplifier circuit and on the reference signal, wherein the amplifier circuit has a capacitor element and an amplifier, the amplifier of the amplifier circuit has an input portion and an output portion coupled through the capacitor element, the reference signal generating circuit has a capacitor element and an amplifier, the amplifier of the reference signal generating circuit has an input portion and an output portion coupled through the capacitor element, the capacitor element of the amplifier circuit and the capacitor element of the reference signal generating circuit are the same structure, and a connecting configuration between an electrode of the capacitor element and a terminal of the amplifier in the amplifier circuit, and a connecting configuration between an electrode of the capacitor element and a terminal of the amplifier in the reference signal generating circuit are the same. According to the other aspect of the embodiments, the solid-state imaging apparatus includes: a plurality of pixels arranged two dimensionally, each pixel including a photoelectric conversion element; amplifier circuits, each arranged correspondingly to each of the columns of the pixels, configured to amplify a signal from the pixel; a reference signal generating circuit configured to generate a reference signal that changes monotonously with time; and an A/D conversion circuit configured to perform an analog-to-digital conversion the signal from the pixel, based on a signal outputted from the amplifier circuit and on the reference signal generated by the reference signal generating circuit, wherein the amplifier circuit has a first capacitor element and a first amplifier, the first amplifier has an input portion and an output portion coupled through the first capacitor element, the reference signal generating circuit has a second capacitor element and a second amplifier, the second amplifier has an input portion and an output portion coupled through the second capacitor element, each of the first and second capacitor elements has a first electrode provided in a semiconductor substrate, an insulating layer provided on the first electrode, and a second electrode provided on the insulating layer, and wherein the first electrode of the first capacitor element is connected electrically to the input portion of the first amplifier, the second electrode of the first capacitor element is connected electrically to the output portion of the first amplifier, and the first electrode of the second capacitor element is connected electrically to the input portion of the second amplifier, the second electrode of the second capacitor element is connected electrically to the output portion of the second amplifier, or wherein the first electrode of the first capacitor element is connected electrically to the output portion of the first amplifier, the second electrode of the first capacitor element is connected electrically to the input portion of the first amplifier, and the first electrode of the second capacitor element is connected electrically to the output portion of the second amplifier, the second electrode of the second capacitor element is connected electrically to the input portion of the second amplifier.

The embodiments can enhance A/D conversion accuracy.

Further features of the disclosure will become apparent from the following description of exemplary embodiments with reference to the attached drawings.

DESCRIPTION OF THE EMBODIMENTS

Preferred embodiments of the embodiments will now be described in detail in accordance with the accompanying drawings.

Embodiments according to the embodiments will be described below with reference to the drawings.

First Embodiment

A first embodiment of the disclosure will be described below.

Figure 1:
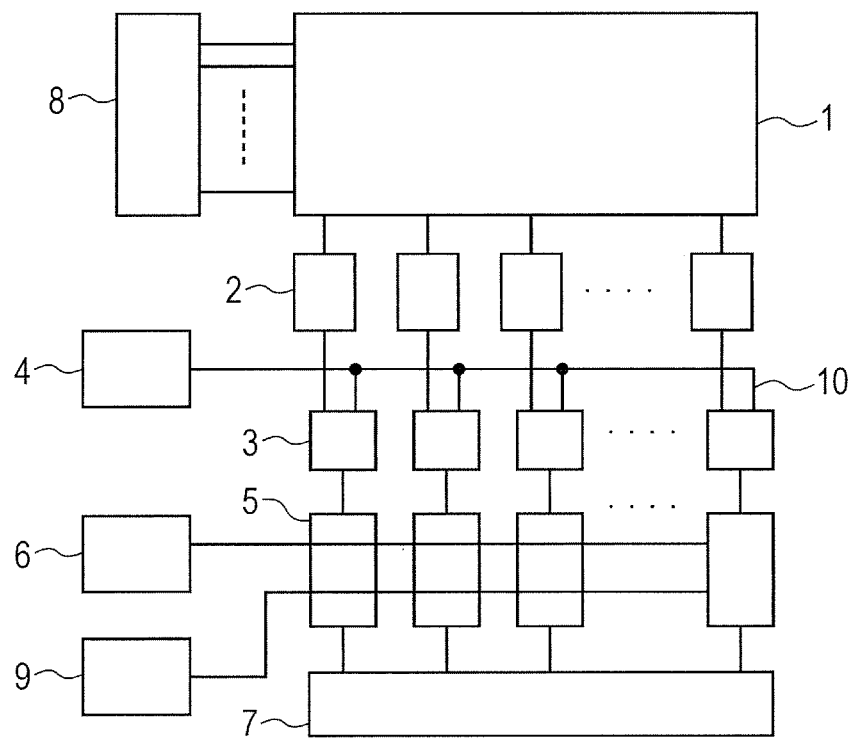
FIG. 1 is a view illustrating one example of a structure of a solid-state imaging apparatus.

FIG. 1 is a schematic view illustrating a configuration example of a circuit of a solid-state imaging apparatus according to a first embodiment. The solid-state imaging apparatus has a pixel unit 1, an amplifier circuit 2, a comparison unit 3, a reference signal generating circuit 4, a storage unit 5, a counter circuit 6, a horizontal scanning circuit 7, a vertical scanning circuit 8 and a signal processing circuit 9. The pixel unit 1 has a plurality of pixels including a photoelectric conversion element, and the pixels are arranged two dimensionally in the unit (line direction and column direction). The amplifier circuit 2, the comparison unit 3 and the storage unit 5 are arranged in each of the columns so as to correspond to each of the columns of the pixel unit 1. The comparison unit 3, the storage unit 5 and the counter circuit 6 constitute an A/D conversion circuit for analog-to-digital converting the pixel signal sent from the pixel which the pixel unit 1 has.

Figure 4:
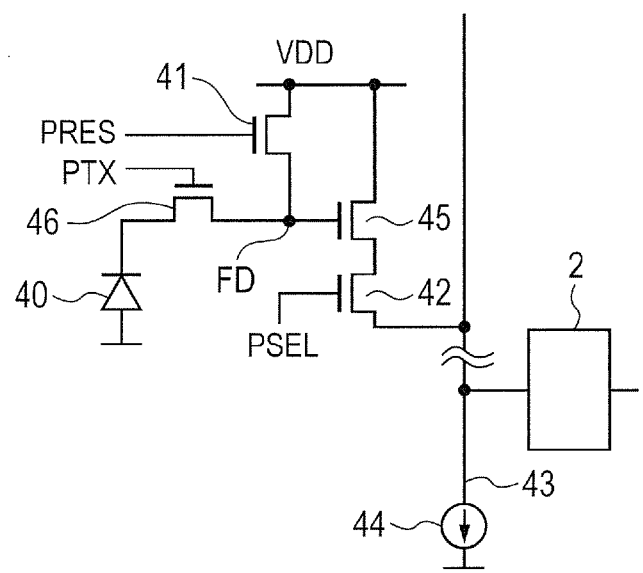
FIG. 4 is a view illustrating one example of a structure of a pixel.

Each of the pixels which the pixel unit 1 has, for instance, has a photoelectric conversion element (photodiode) 40 and four MOS transistors 41, 42, 45 and 46, as is illustrated in FIG. 4. The photoelectric conversion element 40 generates an electric charge through photoelectric conversion. The transistor 46 is a transfer transistor for reading an electric charge accumulated in the photoelectric conversion element 40, and the conduction/non-conduction (ON/OFF) is controlled by a signal PTX. The transistor 41 is a transistor for resetting, which resets a floating diffusion portion FD, and the conduction/non-conduction (ON/OFF) is controlled by a signal PRES.

The transistor 45 is a transistor for a source follower, which amplifies an electric charge in the floating diffusion portion FD and converts the amplified electric charge into a signal voltage. The transistor 42 is a transistor for line selection, which selects the line of the pixels arranged two dimensionally, by controlling the connection of the output of the source follower with a pixel signal outputting line 43, and the conduction/non-conduction (ON/OFF) is controlled by a signal PSEL. A constant current source 44 is a constant current source for the source follower.

The amplifier circuit 2 has a first capacitive feedback type amplifier, and amplifies a pixel signal which is read from the pixel unit 1. The pixel signal which has been amplified by the amplifier circuit 2, and a ramp signal which is generated in the reference signal generating circuit 4 and is supplied through a signal line 10 are inputted to the comparison unit 3. The comparison unit 3 includes a differential input type comparator, compares the magnitude of the voltages between the pixel signal and the ramp signal, and shifts the output from a high level to a low level or from a low level to a high level, when the magnitude relation of the signal voltage is reversed.

The reference signal generating circuit 4 has a second capacitive feedback type amplifier, and generates the ramp signal which is a reference signal. The reference signal generating circuit 4 is connected in common with a plurality of the comparison units 3. Here, the ramp signal is a signal of which the signal level (magnitude of signal) changes in a monotonous tendency, and is a signal of which the output voltage, for instance, increases in a monotonous tendency or reduces in a monotonous tendency. The counter circuit 6 is connected in common with the storage units 5 in a plurality of columns, counts the value according to the output of the ramp signal which is the reference signal sent from the reference signal generating circuit 4, and outputs the count value.

The storage unit 5 stores the count value outputted from the counter circuit 6 as digital data at a timing at which the output potential of the corresponding comparison unit 3 is reversed. The storage unit 5 can store two types of data of a base signal N and an effective signal S of the pixel signal, as digital data. When the storage unit 5 stores the two types of the data, the data is subjected to differential processing in the signal processing circuit 9 (S-N) of the latter stage. For information, if the counter circuit 6 has functions of a down mode and an up mode, the count result becomes a differential processing result of (S-N), and then the storage unit 5 may have a function of storing one type of data.

The digital data stored in each of the columns of the storage units 5 is sequentially transferred to the signal processing circuit 9 by the horizontal scanning circuit 7. A series of the operations for reading the pixel signal sent from these pixels are performed while the lines of the pixels of the pixel unit 1 are selected by the vertical scanning circuit 8. For information, a circuit for controlling the pulse necessary for each of the circuits and controlling its timing is omitted in FIG. 1.

Figure 2:
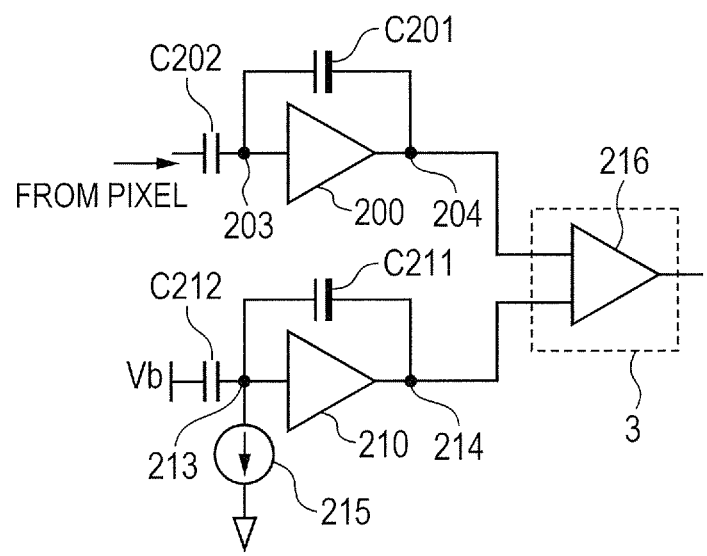
FIG. 2 is a view illustrating one example of a structure of an amplifier circuit and a reference signal generating circuit.

FIG. 2 is a view illustrating a configuration example of circuits of an amplifier circuit 2 and a reference signal generating circuit 4, according to the first embodiment. The amplifier circuit 2 has a computing amplifier 200, a feedback capacitor C201 and an input capacitor C202. The computing amplifier 200 is a reversal amplifier, and its input terminal 203 is connected to a pixel signal output line through the input capacitor C202. The input terminal (input unit) 203 and the output terminal (output unit) 204 of the computing amplifier 200 are connected to each other by the feedback capacitor C201, and form a negative feedback structure. The gain of the amplifier circuit 2 is determined by the capacitance values of the capacitors C201 and C202, and the gain=(capacitance value of input capacitor C202)/(capacitance value of feedback capacitor C201).

The reference signal generating circuit 4 has a computing amplifier 210, the feedback capacitor C211, a clamp capacitor C212, and a constant current source 215. The computing amplifier 210 is a reversal amplifier, and its input terminal 213 is connected to one electrode of the clamp capacitor C212 and the constant current source 215. A voltage Vb which sets an initial value of the ramp signal is supplied to the other electrode of the clamp capacitor C212. In addition, the input terminal (input unit) 213 and the output terminal (output unit) 214 of the computing amplifier 210 are connected to each other by the feedback capacitor C211, and form a negative feedback structure. The reference signal generating circuit 4 generates the ramp signal, by integrating an electric current of the constant current source 215 by the feedback capacitor C211.

The comparison unit 3 has a comparator 216 which has a first input terminal connected to the amplifier circuit 2, has a second input terminal connected to the reference signal generating circuit 4, and compares a pixel signal sent from the amplifier circuit 2 with a ramp signal sent from the reference signal generating circuit 4.

In the present embodiment, the feedback capacitor C201 of the amplifier circuit 2 and the feedback capacitor C211 of the reference signal generating circuit 4 employ a capacitor element having the same structure. For instance, a diffusion capacitor illustrated in FIG. 3A, or an MIM (Metal-Insulator-Metal) capacitor illustrated in FIG. 3B is used for the feedback capacitors C201 and C211.

Figure 3A:
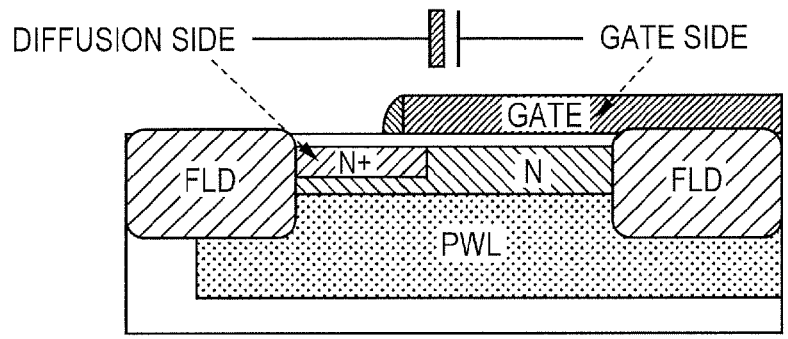
FIG. 3A is a view illustrating one example of a structure of a capacitor element.
Figure 3B:
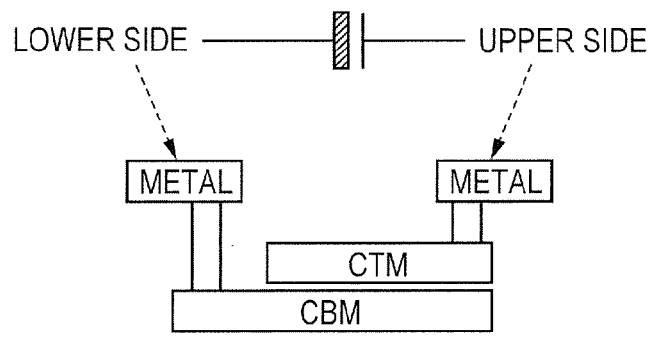
FIG. 3B is a view illustrating another example of a structure of the capacitor element.

FIG. 3A is a view illustrating a configuration example of a diffusion capacitor which can be applied to the feedback capacitors C201 and C211. The diffusion capacitor illustrated in FIG. 3A has an MIS (Metal-Insulator-Semiconductor) structure, in which a gate side electrode (GATE) is metal or polysilicon, and a diffusion side electrode (N+ and N) is an N-type semiconductor region. In addition, in FIG. 3A, PWL is a P-type semiconductor region, and FLD is an insulating film layer. When the diffusion capacitor illustrated in FIG. 3A is used for the feedback capacitors C201 and C211, any one electrode of the gate side electrode and the diffusion side electrode is connected to the input terminal 203 of the computing amplifier 200, and the input terminal 213 of the computing amplifier 210, respectively. In addition, the other electrode of the gate side electrode and the diffusion side electrode is connected to the output terminal 204 of the computing amplifier 200, and the output terminal 214 of the computing amplifier 210, respectively.

Specifically, when the gate side electrode in the feedback capacitor C201 and the input terminal 203 of the computing amplifier 200 are connected to each other, the gate side electrode in the feedback capacitor C211 and the input terminal 213 of the computing amplifier 210 are connected to each other. In addition, at this time, the diffusion side electrode in the feedback capacitor C201 and the output terminal 204 of the computing amplifier 200 are connected to each other, and the diffusion side electrode in the feedback capacitor C211 and the output terminal 214 of the computing amplifier 210 are connected to each other. Similarly, when the diffusion side electrode in the feedback capacitor C201 and the input terminal 203 of the computing amplifier 200 are connected to each other, the diffusion side electrode in the feedback capacitor C211 and the input terminal 213 of the computing amplifier 210 are connected to each other. In addition, at this time, the gate side electrode in the feedback capacitor C201 and the output terminal 204 of the computing amplifier 200 are connected to each other, and the gate side electrode in the feedback capacitor C211 and the output terminal 214 of the computing amplifier 210 are connected to each other.

Thus, when the feedback capacitors C201 and C211 of the capacitor elements having the same structure are connected to the computing amplifiers 200 and 210 in the same connecting configuration, respectively, the voltage dependencies of the capacitances become equal between the feedback capacitor C201 of the amplifier circuit 2 and the feedback capacitor C211 of the reference signal generating circuit 4. For information, the diffusion capacitor illustrated in FIG. 3A is an N-type diffusion capacitor formed on the P-type semiconductor region PWL, but the diffusion capacitor is not limited to this, and may be a P-type diffusion capacitor which has the diffusion side electrode of the P-type semiconductor region arranged on the N-type semiconductor region.

FIG. 3B is a view illustrating a configuration example of an MIM capacitor which can be applied to the feedback capacitors C201 and C211. The MIM capacitor illustrated in FIG. 3B has two metal electrodes of a lower side electrode (CBM) and an upper side electrode (CTM), and has an insulating film between the lower side electrode (CBM) and the upper side electrode (CTM). When the MIM capacitor illustrated in FIG. 3B is used for the feedback capacitors C201 and C211, any one electrode of the upper side electrode and the lower side electrode is connected to the input terminal 203 of the computing amplifier 200, and the input terminal 213 of the computing amplifier 210, respectively. In addition, the other electrode of the upper side electrode and the lower side electrode is connected to the output terminal 204 of the computing amplifier 200, and the output terminal 214 of the computing amplifier 210, respectively. The lower side electrode is provided in a semiconductor substrate.

Specifically, when the upper side electrode in the feedback capacitor C201 and the input terminal 203 of the computing amplifier 200 are connected to each other, the upper side electrode in the feedback capacitor C211 and the input terminal 213 of the computing amplifier 210 are connected to each other. In addition, at this time, the lower side electrode in the feedback capacitor C201 and the output terminal 204 of the computing amplifier 200 are connected to each other, and the lower side electrode in the feedback capacitor C211 and the output terminal 214 of the computing amplifier 210 are connected to each other. Similarly, when the lower side electrode in the feedback capacitor C201 and the input terminal 203 of the computing amplifier 200 are connected to each other, the lower side electrode in the feedback capacitor C211 and the input terminal 213 of the computing amplifier 210 are connected to each other. In addition, at this time, the upper side electrode in the feedback capacitor C201 and the output terminal 204 of the computing amplifier 200 are connected to each other, and the upper side electrode in the feedback capacitor C211 and the output terminal 214 of the computing amplifier 210 are connected to each other.

Thus, when the feedback capacitors C201 and C211 of the capacitor elements having the same structure are connected to the computing amplifiers 200 and 210 in the same connecting configuration, respectively, the voltage dependencies of the capacitances become equal between the feedback capacitor C201 of the amplifier circuit 2 and the feedback capacitor C211 of the reference signal generating circuit 4.

Figure 5:
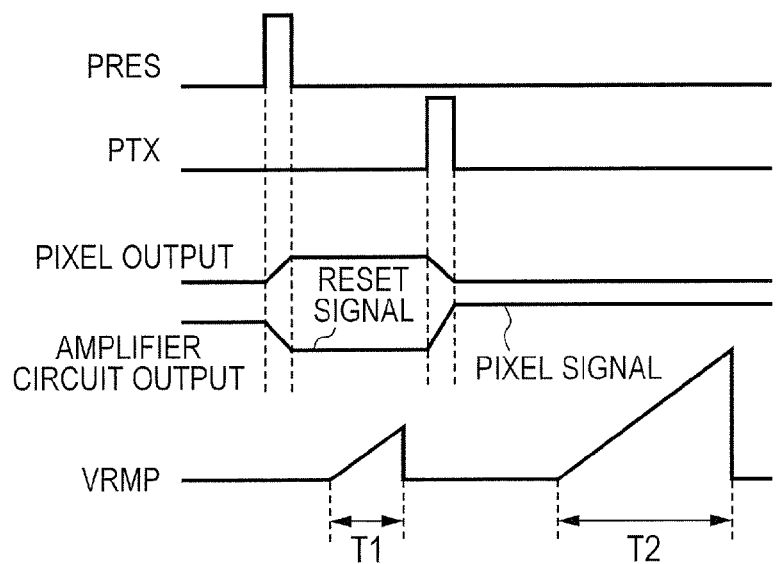
FIG. 5 is a view illustrating one example of a driving timing.

Next, the operation of the solid-state imaging apparatus according to the first embodiment will be described below. FIG. 5 is a timing chart illustrating a driving timing according to the first embodiment, and illustrates a timing chart for describing the circuit operation of the pixels for one pixel line and the operation of the reference signal generating circuit. For information, though the illustration is omitted in FIG. 5, the pixel selection signal PSEL corresponding to the line from which the pixel signal is read shall be a high level. A reset signal which has reset the pixel unit 1 and the photoelectric conversion signal which has been superimposed on the reset signal are read from the pixel unit 1 as the pixel signal.

Firstly, the signal PRES changes to the high level, thereby the transistor 41 for reset is converted to an ON state, and the floating diffusion portion FD is reset. Next, the signal PRES changes to the low level, thereby the transistor 41 for reset is converted to an Off state, and the reset signal is outputted through the amplifier circuit 2. This reset signal is subjected to first A/D conversion processing, in the period of time T1. In the first A/D conversion processing, the comparison unit 3 compares the reset signal with the ramp signal VRMP, and the output of the comparison unit 3 is shifted from the high level to the low level or from the low level to the high level, when the magnitude relation is reversed. At the timing at which the output potential of this comparison unit 3 is reversed, the storage unit 5 stores the count value which is outputted from the counter circuit 6, as first digital data.

Subsequently, after the first A/D conversion processing has been completed, the signal PTX changes to the high level in the pixel unit 1, the electric charge accumulated in the photoelectric conversion element 40 is transferred to the floating diffusion portion FD, and thereby the pixel signal is outputted from the amplifier circuit 2. Similarly to the case of the reset signal, the pixel signal is subjected to second A/D conversion processing, in the period of time T2. At the timing at which the magnitude relation between the pixel signal and the ramp signal VRMP is reversed and the output potential of the comparison unit 3 is reversed, the storage unit 5 stores the count value which is outputted from the counter circuit 6, as second digital data.

The first and second digital data which have been stored in the storage unit 5 in each of the columns are transferred to the signal processing circuit 9 by the horizontal scanning circuit 7. The variation of the characteristics among the comparison units 3 in each of the columns can be eliminated by the differential processing which is performed for the first and second digital data in the signal processing circuit 9. For information, the differential processing may not be performed in the signal processing circuit 9, but signal processing such as the differential processing may be performed in the outside of the solid-state imaging apparatus.

The value of the digital data, which is obtained as a result of the processing in the above described first A/D conversion processing and the second A/D conversion processing, is determined by the voltages of signals (reset signal and pixel signal) sent from the pixel and the ramp signal which is a reference signal. In the present embodiment, the voltage dependencies of the capacitances of the feedback capacitor C201 of the amplifier circuit 2 and the feedback capacitor C211 of the reference signal generating circuit 4 are equal, and accordingly the solid-state imaging apparatus can reduce an A/D conversion error and can enhance A/D conversion accuracy, without aggravating the linearity in the A/D conversion.

In addition, the amplifier circuit 2 and the reference signal generating circuit 4 may have a switch for switching between the short circuit or the opening of the input and output terminals, though the switch is omitted in FIG. 2. The feedback capacitors C201 and C211 are reset by making the respective switches conduct. In the timing chart of FIG. 5 in particular, a noise due to the pixel can be reduced, by turning the switch ON at a timing at which the signal PRES is shifted from the high level to the low level and then turning the switch OFF before the A/D conversion period T1 starts. In this case, an offset component originating in the amplifier circuit 2 is subjected to the A/D conversion processing, in the period T1.

Second Embodiment

Next, the second embodiment of the disclosure will be described below.

Figure 6A:
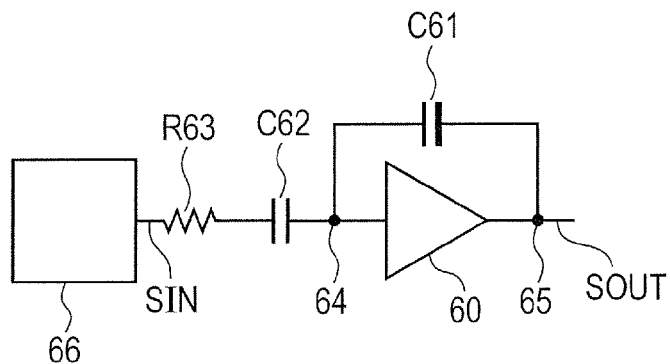
FIG. 6A is a view illustrating one example of a structure of a reference signal generating circuit.
Figure 6B:
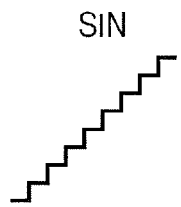
FIG. 6B is a view illustrating one example of a signal which is inputted into an input resistance of the reference signal generating circuit.
Figure 6C:
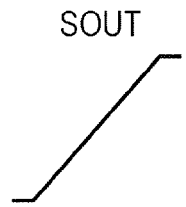
FIG. 6C is a view illustrating one example of a signal which is outputted from the reference signal generating circuit.

The solid-state imaging apparatus according to the second embodiment is similar to the above described solid-state imaging apparatus according to the first embodiment except for the reference signal generating circuit, and accordingly a part which is different from the first embodiment will be described below. FIGS. 6A to 6C are views illustrating a configuration example of a circuit of a reference signal generating circuit 4 according to the second embodiment.

As is illustrated in FIG. 6A, the reference signal generating circuit 4 has a computing amplifier 60, a feedback capacitor C61, a low pass filter including an input capacitor C62 and an input resistance R63, and a signal generating unit 66. The computing amplifier 60 is a reversal amplifier, and the input terminal 64 is connected to the signal generating unit 66 through a series circuit in which the input capacitor C62 and the input resistance R63 are connected in series. In addition, the input terminal (input unit) 64 and the output terminal (output unit) 65 of the computing amplifier 60 are coupled to each other by the feedback capacitor C61, and form a negative feedback structure. The gain of the low pass filter is determined by the capacitance values of the capacitors C61 and C62, and the gain=(capacitance value of input capacitor C62)/(capacitance value of feedback capacitor C61). The band of the low pass filter is determined by the capacitance value of the capacitor C62 and the resistance value of the resistance R63, and the band=$1/(2\pi \times$(capacitance value of input capacitor C62)$\times$(resistance value of input resistance R63)).

The signal generating unit 66 generates a step-shaped signal SIN as illustrated in FIG. 6B. The signal SIN which has been outputted from the signal generating unit 66 is outputted from the reference signal generating circuit 4 in a form of a ramp signal SOUT as illustrated in FIG. 6C, after having passed through the above described low pass filter.

The feedback capacitor C201 of the amplifier circuit 2 and the feedback capacitor C61 of the reference signal generating circuit 4 employ a capacitor element having the same structure, and are connected to the computing amplifier 200 of the amplifier circuit 2 and the computing amplifier 60 of the reference signal generating circuit 4, in the same connecting configuration. Thereby, the voltage dependencies of the capacitances of the feedback capacitor C201 of the amplifier circuit 2 and the feedback capacitor C61 of the reference signal generating circuit 4 become equal, and the solid-state imaging apparatus can reduce an A/D conversion error and can enhance A/D conversion accuracy, without aggravating the linearity in the A/D conversion. For information, the capacitors to be used as the feedback capacitors C201 and C61 are, for instance, the diffusion capacitor illustrated in FIG. 3A, or the MIM capacitor illustrated in FIG. 3B.

Incidentally, a structure is illustrated in FIG. 1, in which circuits such as the amplifier circuit 2 and the comparison unit 3 are arranged only in the lower side of the pixel unit 1, as one example of the solid-state imaging apparatuses in the embodiments of the disclosure, but the disclosure is not limited to the structure. The solid-state imaging apparatus may have a structure in which the same circuit as in the lower side of the pixel unit 1 is arranged also in the upper side. In this case, it is desirably determined which side of the upper side or the lower side reads the pixel signal positioned in each column. In addition, in the structure illustrated as one example, the storage unit 5 is provided in each of the columns and the counter circuit 6 is provided so as to be connected in common with the storage units 5 in the plurality of the columns, but the disclosure is not limited to the structure and may have, for instance, a structure in which the counter circuits 6 are arranged in each of the columns.

Note that the above embodiments are merely examples how the disclosure can be practiced, and the technical scope of the disclosure should not be restrictedly interpreted by the embodiments. In other words, the present invention can be practiced in various ways without departing from the technical concept and main features of the disclosure.

INDUSTRIAL APPLICABILITY

The solid-state imaging apparatus according to the embodiments can be applied, for instance, to a scanner, a video camera, and a digital still camera.

While the embodiments have been described with reference to exemplary embodiments, it is to be understood that the embodiments are not limited to the disclosed exemplary embodiments. The scope of the following claims is to be accorded the broadest interpretation so as to encompass all such modifications and equivalent structures and functions.

This application claims the benefit of Japanese Patent Application No. 2011-223309 filed Oct. 7, 2011, which is hereby incorporated by reference herein in its entirety.

What is claimed is:

1. A solid-state imaging apparatus comprising:
   a plurality of pixels arranged two dimensionally, each pixel including a photoelectric conversion element;
   amplifier circuits, each arranged correspondingly to each of the columns of the pixels, configured to amplify a signal from the pixel;
   a reference signal generating circuit configured to generate a reference signal that changes monotonously with time; and an A/D conversion circuit configured to perform an analog-to-digital conversion of the signal from the pixel, based on a signal outputted from the amplifier circuit and on the reference signal, wherein the amplifier circuit has a capacitor element and an amplifier, the amplifier of the amplifier circuit has an input portion and an output portion coupled through the capacitor element, the reference signal generating circuit has a capacitor element and an amplifier, the amplifier of the reference signal generating circuit has an input portion and an output portion coupled through the capacitor element, the capacitor element of the amplifier circuit and the capacitor element of the reference signal generating circuit are the same structure, and a connecting configuration between an electrode of the capacitor element and a terminal of the amplifier in the amplifier circuit, and a connecting configuration between an electrode of the capacitor element and a terminal of the amplifier in the reference signal generating circuit are the same.

2. The solid-state imaging apparatus according to claim 1, wherein
the capacitor element of the amplifier circuit and the capacitor element of the reference signal generating circuit are diffusion capacitors each.

3. The solid-state imaging apparatus according to claim 1, wherein
the capacitor element of the amplifier circuit and the capacitor element of the reference signal generating circuit are MIM capacitors each.

4. A solid-state imaging apparatus comprising:
a plurality of pixels arranged two dimensionally, each pixel including a photoelectric conversion element;
amplifier circuits, each arranged correspondingly to each of the columns of the pixels, configured to amplify a signal from the pixel;
a reference signal generating circuit configured to generate a reference signal that changes monotonously with time; and
an A/D conversion circuit configured to perform an analog-to-digital conversion the signal from the pixel, based on a signal outputted from the amplifier circuit and on the reference signal generated by the reference signal generating circuit, wherein the amplifier circuit has a first capacitor element and a first amplifier, the first amplifier has an input portion and an output portion coupled through the first capacitor element, the reference signal generating circuit has a second capacitor element and a second amplifier, the second amplifier has an input portion and an output portion coupled through the second capacitor element, each of the first and second capacitor elements has a first electrode provided in a semiconductor substrate, an insulating layer provided on the first electrode, and a second electrode provided on the insulating layer, and wherein the first electrode of the first capacitor element is connected electrically to the input portion of the first amplifier, the second electrode of the first capacitor element is connected electrically to the output portion of the first amplifier, and the first electrode of the second capacitor element is connected electrically to the input portion of the second amplifier, the second electrode of the second capacitor element is connected electrically to the output portion of the second amplifier, or wherein the first electrode of the first capacitor element is connected electrically to the output portion of the first amplifier, the second electrode of the first capacitor element is connected electrically to the input portion of the first amplifier, and the first electrode of the second capacitor element is connected electrically to the output portion of the second amplifier, the second electrode of the second capacitor element is connected electrically to the input portion of the second amplifier.

5. The solid-state imaging apparatus according to claim 4, wherein
the first and second capacitor elements are diffusion capacitors each.

6. The solid-state imaging apparatus according to claim 4, wherein
the first and second capacitor elements are MIM capacitors each.

* * * * *